United States Patent
Lee et al.

(10) Patent No.: US 9,825,258 B2
(45) Date of Patent: Nov. 21, 2017

(54) LAYERED STRUCTURE FOR OLED DEVICE, METHOD FOR MANUFACTURING THE SAME, AND OLED DEVICE HAVING THE SAME

(71) Applicant: SAINT-GOBAIN GLASS FRANCE, Seoul (KR)

(72) Inventors: Young Seong Lee, Seoul (KR); Jin Woo Han, Seoul (KR); Ji Woong Baek, Seoul (KR)

(73) Assignee: SAINT-GOBAIN GLASS FRANCE, Courbevoie (FR)

( * ) Notice: Subject to any disclaimer, the term of this patent is extended or adjusted under 35 U.S.C. 154(b) by 0 days.

(21) Appl. No.: 14/408,118

(22) PCT Filed: Jun. 14, 2013

(86) PCT No.: PCT/KR2013/005291
§ 371 (c)(1),
(2) Date: Dec. 15, 2014

(87) PCT Pub. No.: WO2013/187736
PCT Pub. Date: Dec. 19, 2013

(65) Prior Publication Data
US 2015/0179979 A1 Jun. 25, 2015

Related U.S. Application Data

(60) Provisional application No. 61/659,597, filed on Jun. 14, 2012.

(30) Foreign Application Priority Data

Jun. 14, 2012 (KR) .................. 10-2012-0063851

(51) Int. Cl.
*H01L 29/08* (2006.01)
*H01L 51/52* (2006.01)
(Continued)

(52) U.S. Cl.
CPC .......... *H01L 51/5268* (2013.01); *C03C 3/066* (2013.01); *C03C 3/068* (2013.01);
(Continued)

(58) Field of Classification Search
CPC ............. H01L 51/5268; H01L 51/0096; H01L 2251/5369; H01L 51/5012; H01L 51/5262
See application file for complete search history.

(56) References Cited

U.S. PATENT DOCUMENTS

2005/0142379 A1 6/2005 Juni et al.
2005/0231106 A1 10/2005 Tanaka et al.
(Continued)

FOREIGN PATENT DOCUMENTS

| CA | 2 777 658 A | 4/2011 |
|---|---|---|
| EP | 2 219 416 A1 | 8/2010 |

(Continued)

OTHER PUBLICATIONS

International Search Report issued in International Patent Application No. PCT/KR2013/005291, dated Oct. 2, 2013.
(Continued)

*Primary Examiner* — Khiem D Nguyen
(74) *Attorney, Agent, or Firm* — Pillsbury Winthrop Shaw Pittman LLP

(57) ABSTRACT

A layered structure for an organic light-emitting diode (OLED) device, the layered structure including a light-transmissive substrate and an internal extraction layer formed on one side of the light-transmissive substrate, in which the internal extraction layer includes (1) a scattering area containing scattering elements composed of solid particles and pores, the solid particles having a density that decreases as it goes away from the interface with the light-transmissive substrate, and the pores having a density that increases as it goes away from the interface with the
(Continued)

light-transmissive substrate, and (2) a free area where no scattering elements are present, formed from the surface of the internal extraction layer, which is opposite to the interface, to a predetermined depth.

19 Claims, 4 Drawing Sheets

(51) Int. Cl.
    *H01L 51/00* (2006.01)
    *H01L 51/50* (2006.01)
    *H01L 51/56* (2006.01)
    *C03C 3/066* (2006.01)
    *C03C 3/068* (2006.01)
    *C03C 17/00* (2006.01)
    *C03C 17/34* (2006.01)
    *C03C 17/42* (2006.01)
    *C03C 8/04* (2006.01)

(52) U.S. Cl.
    CPC .............. *C03C 8/04* (2013.01); *C03C 17/002* (2013.01); *C03C 17/007* (2013.01); *C03C 17/3411* (2013.01); *C03C 17/3435* (2013.01); *C03C 17/42* (2013.01); *H01L 51/0096* (2013.01); *H01L 51/5012* (2013.01); *H01L 51/5056* (2013.01); *H01L 51/5072* (2013.01); *H01L 51/5088* (2013.01); *H01L 51/5092* (2013.01); *H01L 51/5206* (2013.01); *H01L 51/5215* (2013.01); *H01L 51/5221* (2013.01); *H01L 51/5262* (2013.01); *H01L 51/56* (2013.01); *C03C 2217/452* (2013.01); *C03C 2217/475* (2013.01); *C03C 2217/477* (2013.01); *C03C 2217/478* (2013.01); *C03C 2217/48* (2013.01); *C03C 2217/70* (2013.01); *C03C 2217/91* (2013.01); *C03C 2217/948* (2013.01); *C03C 2218/32* (2013.01); *H01L 51/005* (2013.01); *H01L 51/0055* (2013.01); *H01L 51/0058* (2013.01); *H01L 51/0072* (2013.01); *H01L 51/0077* (2013.01); *H01L 51/0081* (2013.01); *H01L 2251/5346* (2013.01); *H01L 2251/5369* (2013.01); *H01L 2251/558* (2013.01); *Y10T 428/24496* (2015.01); *Y10T 428/249961* (2015.04)

(56) References Cited

U.S. PATENT DOCUMENTS

| | | | | |
|---|---|---|---|---|
| 2009/0153972 | A1* | 6/2009 | Nakamura | H01L 51/5268 359/599 |
| 2009/0247385 | A1* | 10/2009 | Ide | C03C 3/066 501/18 |
| 2011/0001159 | A1* | 1/2011 | Nakamura | B82Y 20/00 257/98 |
| 2011/0156063 | A1* | 6/2011 | Lin | H01L 27/322 257/88 |
| 2012/0194065 | A1* | 8/2012 | Aoki | H01L 51/5268 313/504 |
| 2013/0140982 | A1* | 6/2013 | Park | H01L 51/5262 313/504 |
| 2013/0221336 | A1* | 8/2013 | Allano | C03C 3/066 257/40 |

FOREIGN PATENT DOCUMENTS

| | | |
|---|---|---|
| EP | 2 489 643 A1 | 8/2012 |
| FR | 2 963 705 A1 | 2/2012 |
| JP | 2007-106625 A | 4/2007 |
| JP | 2009-245786 A | 10/2009 |
| JP | 2010-170969 A | 8/2010 |
| JP | 2015-517191 A | 6/2015 |
| KR | 10-2010-0051631 A | 5/2010 |
| KR | 10-2010-0101076 A | 9/2010 |
| KR | 10-2012-0007472 A | 1/2012 |
| KR | 10-2012-0024510 A | 3/2012 |
| WO | WO 2009/017035 A1 | 2/2009 |
| WO | WO 2009/060916 A1 | 5/2009 |
| WO | WO 2009/116531 A1 | 9/2009 |
| WO | WO 2011/046156 A1 | 4/2011 |
| WO | WO 2011/046190 A1 | 4/2011 |
| WO | WO 2011/089343 A1 | 7/2011 |
| WO | WO 2012/007575 A1 | 1/2012 |
| WO | WO 2012/017183 A1 | 2/2012 |

OTHER PUBLICATIONS

Office Action as issued in Chinese Patent Application No. 201380030814.3, dated Mar. 9, 2016.
Extended European Search Report as issued in European Patent Application No. 13804767.5, dated Jun. 3, 2016.
Partial Supplementary European Search Report as issued in European Patent Application No. 13804767.5, dated Feb. 8, 2016.
Extended European Search Report as issued in European Patent Application No. 13805168.5, dated Apr. 26, 2016.
Partial Supplementary European Search Report as issued in European Patent Application No. 13805168.5, dated Feb. 15, 2016.
Office Action as issued in Japanese Patent Application No. 2015-517192, dated Jan. 24, 2017.
Notice of Allowance as issued in Korean Patent Application No. 10-2012-0063851, dated Feb. 28, 2017.

* cited by examiner

[Fig. 1]
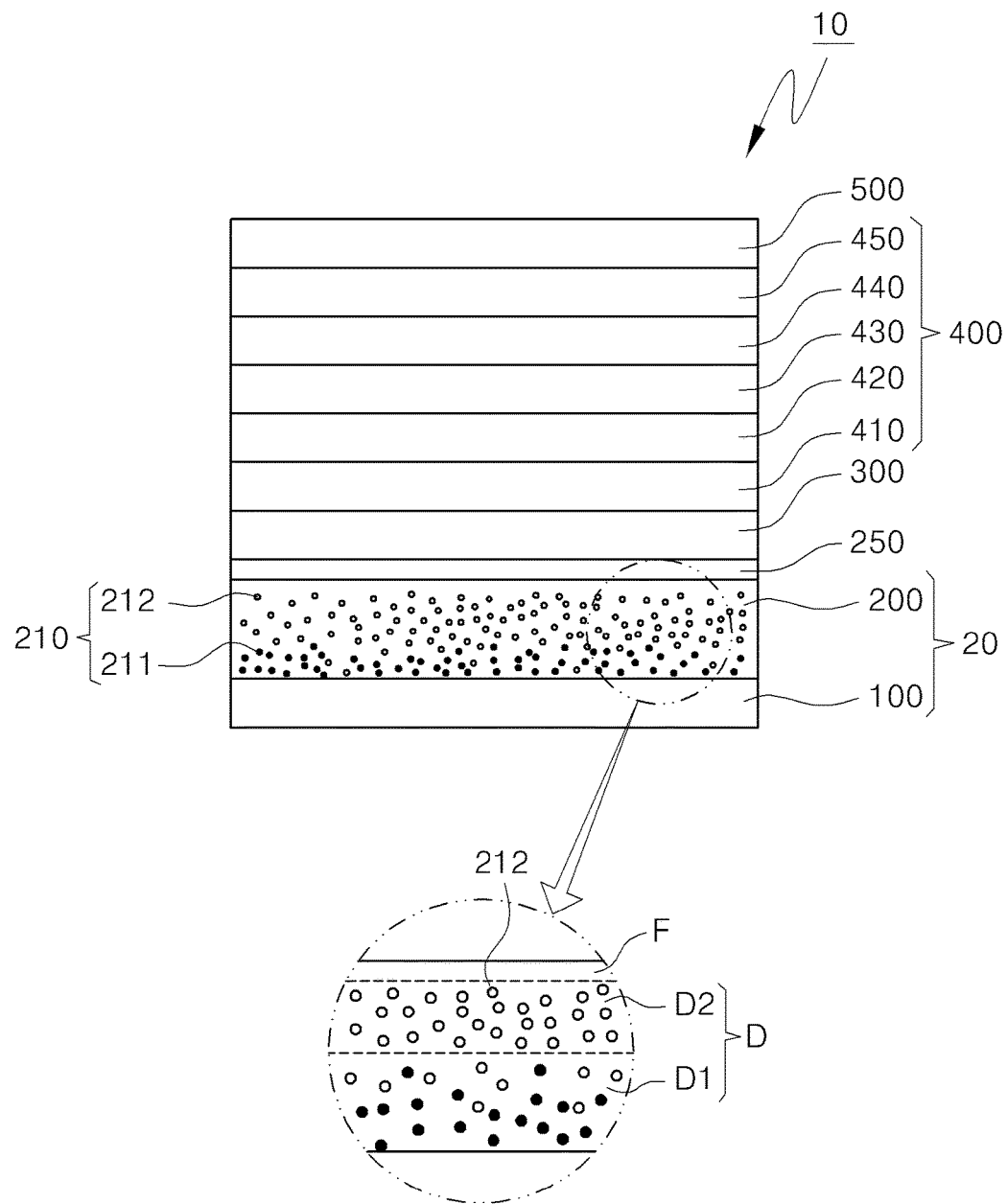

[Fig. 2]
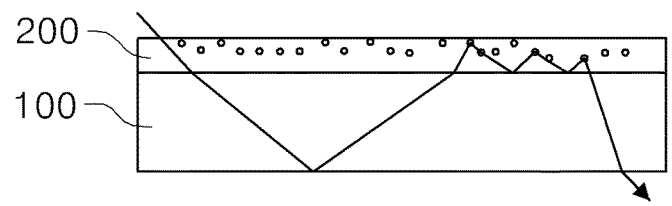
(a)
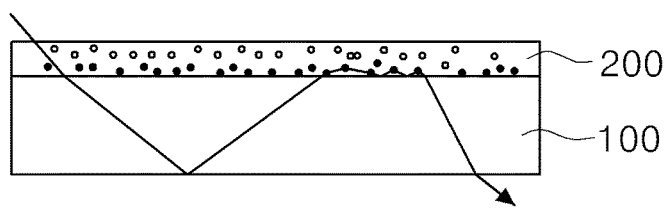
(b)
[Fig. 3]
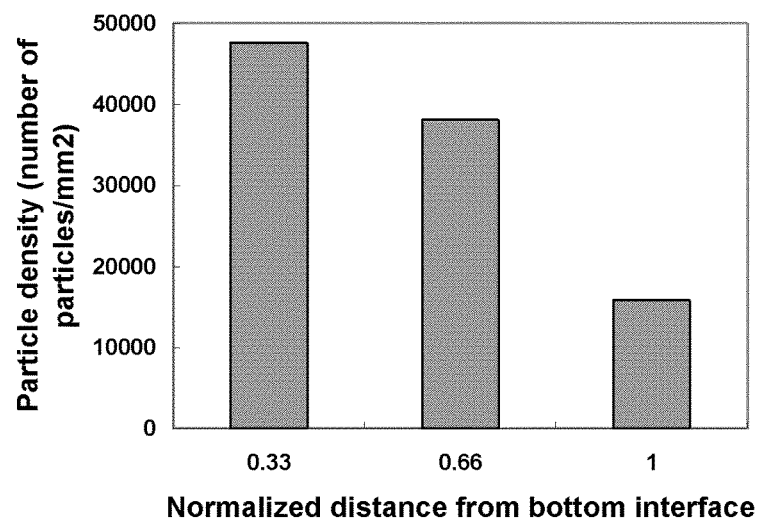
[Fig. 4]
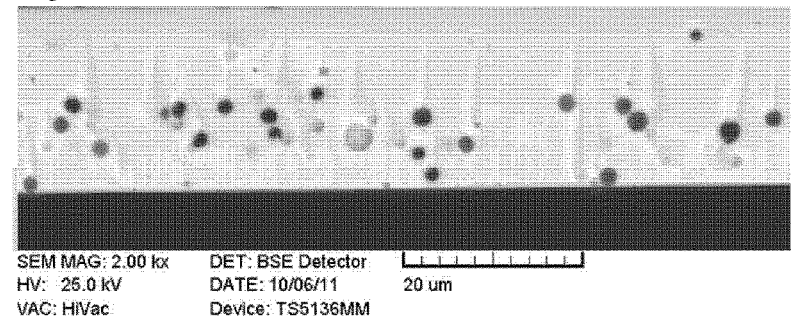

[Fig. 5]
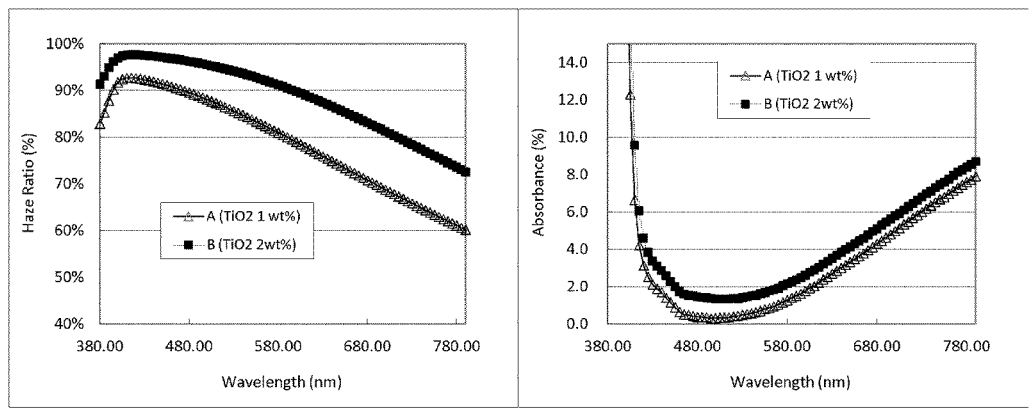
[Fig. 6]
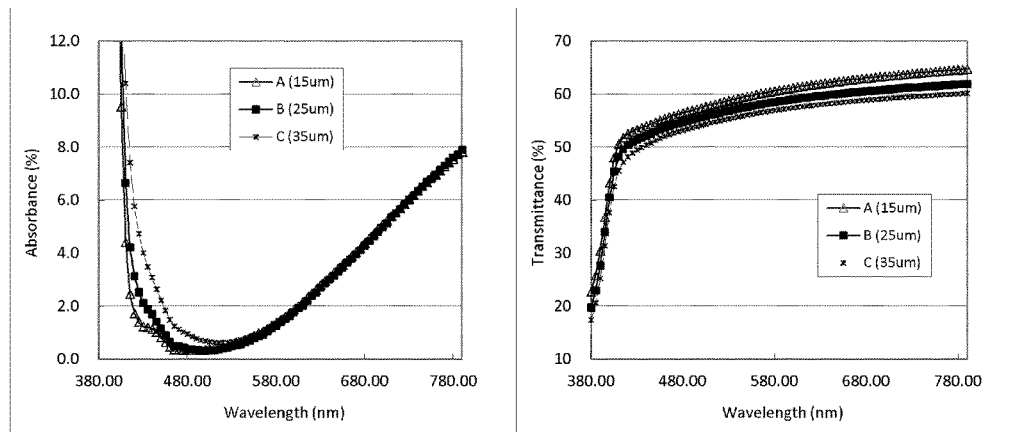
[Fig. 7]
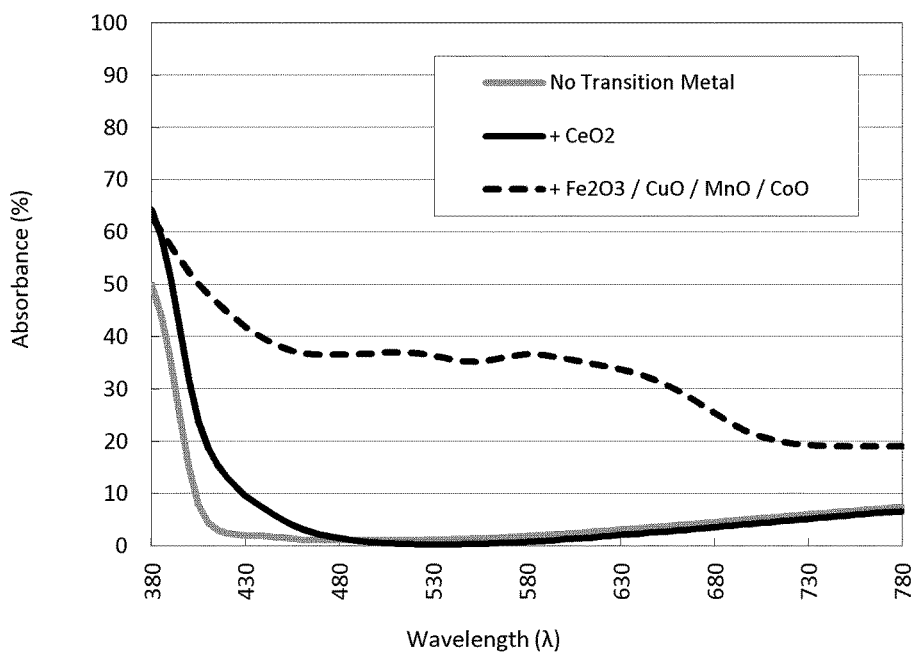

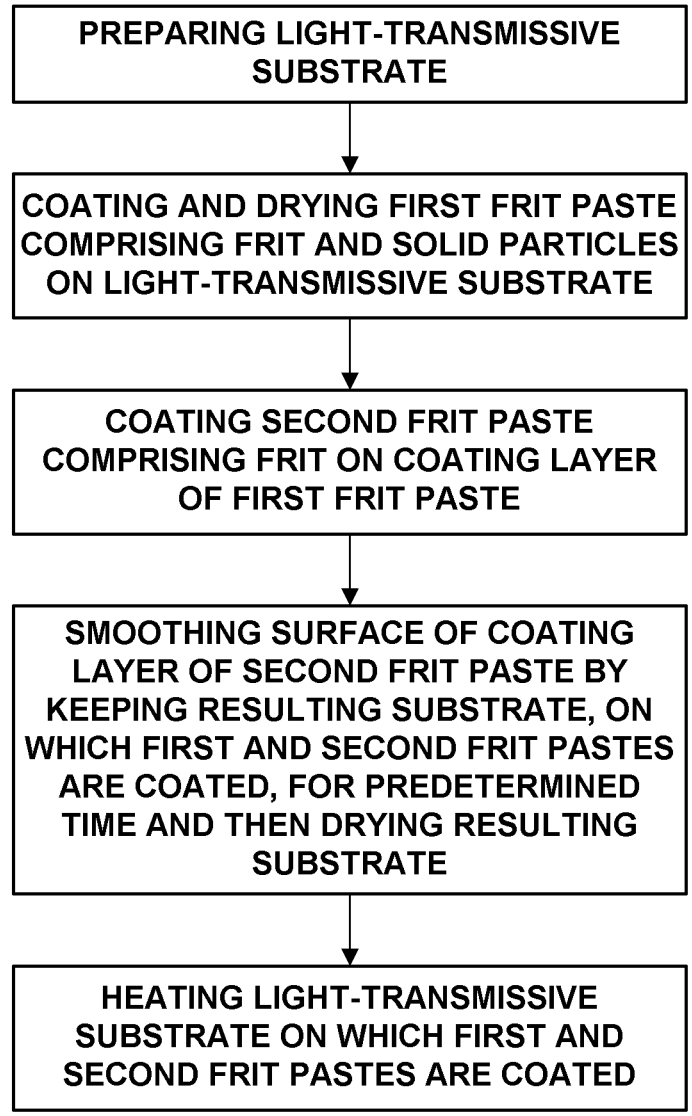
[Fig. 8]

LAYERED STRUCTURE FOR OLED DEVICE, METHOD FOR MANUFACTURING THE SAME, AND OLED DEVICE HAVING THE SAME

CROSS-REFERENCE TO RELATED APPLICATIONS

This application is the U.S. National Stage of PCT/KR2013/005291, filed Jun. 14, 2013, which in turn claims priority to Korean Application No. 10-2012-0063851, filed Jun. 14, 2012 and U.S. Provisional Application No. 61/659,597, filed Jun. 14, 2012. The contents of all of these applications are incorporated herein by reference in their entirety.

TECHNICAL FIELD

The present invention relates to a layered structure for an organic light-emitting diode (OLED) device and, more particularly, to a layered structure for an OLED device, the layered structure comprising an internal extraction layer (IEL) which can effectively extract light, which is lost by a waveguide effect caused by a difference in refractive index between a glass substrate, an ITO layer, and an organic layer and by a total reflection effect caused by a difference in refractive index between the glass substrate and air, to the outside, a method for manufacturing the same, and an OLED device having the same.

BACKGROUND ART

An organic light-emitting diode (OLED) is a device in which organic layers are sandwiched between two electrodes and, when an electric field is applied to the organic layers, electrons and holes are injected from the electrodes and recombine in the organic layer to form excitons, and the excitons decay to the ground state and emit light. The structure of the OLED is relatively simple, requires fewer types of parts, and is advantageous for mass production. The OLEDs have been developed for display purposes, and the field of OLED lighting that uses white OLEDs has recently attracted much attention.

Unlike an OLED panel, an OLED lighting panel does not have separate red, green, and blue (RGB) pixels and emits white light using multiple organic layers. Here, the organic layers used in the OLED lighting panel include a hole injection layer, a hole transporting layer, an emission layer, an electron transporting layer, an electron injection layer, etc. according to their functions.

The OLEDs may be classified into various types depending on the materials used, light-emitting mechanisms, light-emitting directions, driving methods, etc. Here, the OLEDs may be classified according to the light-emitting structure into a bottom emission type OLED that emits light toward a glass substrate and a front emission type OLED that emits light in a direction opposite to the glass substrate. In the case of the bottom emission type OLED, a metal thin film such as aluminum, etc. is used as a cathode to serve as a reflective plate, and a transparent conductive oxide film such as ITO, etc. is used as an anode to serve as a path through which light emits. In the case of the front emission type OLED, the cathode is composed of multilayer thin films including a silver thin film, and the light is emitted through the cathode. However, the front emitting structure is rarely used as the lighting panel, except for a transparent panel that emits light from both sides, and the bottom emission structure is most widely used.

Meanwhile, a phosphorescent OLED can use all excitons, which are formed by recombination of electrons and holes, in the light emission, and thus its theoretical internal quantum efficiency approaches 100%. However, even if the internal quantum efficiency is close to 100%, about 20% of light is emitted to the outside, and about 80% of light is lost by a waveguide effect caused by a difference in refractive index between a glass substrate, an ITO layer, and an organic layer and by a total reflection effect caused by a difference in refractive index between the glass substrate and air.

The refractive index of the inner organic layer is about 1.7 to 1.8, and the refractive index of the ITO layer (i.e., a transparent electrode) generally used as the anode is about 1.9. The thickness of these two layers is as small as about 200 to 400 nm, the refractive index of the glass substrate is about 1.5, and thus a planar waveguide is naturally formed in the OLED. According to the calculation, the amount of light lost by the waveguide effect appears to be about 45%.

Moreover, the refractive index of the glass substrate is about 1.5 and the refractive index of external air is about 1.0. As a result, when light escapes from the glass substrate to the outside, the light incident beyond the critical angle causes total reflection and is trapped in the glass substrate, and the light trapped in this manner amounts to about 35%.

As a result, only about of 20% of light is emitted to the outside due to the waveguide effect between the glass substrate, the ITO layer, and the organic layer and due to the total reflection effect between the glass substrate and the air layer, and thus the external light efficiency of the OLED remains in a low level due to the low light extraction efficiency.

Therefore, a technology for extracting light trapped in the OLED is desired to improve the external light efficiency of the OLED. Here, a technology for extracting light trapped between the organic layer and the ITO layer to the outside is called internal light extraction, and a technology for extracting light trapped in the glass substrate to the outside is called external light extraction. The light extraction technologies have attracted much attention as a core technology that can improve the efficiency, brightness, and lifespan of the OLED lighting panel. In particular, the internal light extraction technology is evaluated as an effective technology that can theoretically achieve an improvement of external light efficiency of more than three times, but it sensitively affects the internal interface of the OLED. Thus, the internal light extraction technology needs to satisfy electrical, mechanical, and chemical properties in addition to the optical effect.

At present, the external light extraction technology, which attaches a micro-lens array (MLA) film, a light-scattering film, etc. to the external surface of the OLED panel, has already been established, but the internal light extraction technology has not yet reached a practical stage.

According to research reports, it is known that the internal light extraction technologies such as inner light-scattering layers, substrate surface deformation, refractive index modulation layers, photonic crystals, nanostructure formation, etc. have an effect on the internal light extraction. The key point of the internal light extraction technology is to scatter, diffract or refract the light trapped by the waveguide effect to form an incident angle smaller than the critical angle such that the light is extracted to the outside of an optical waveguide.

However, the above technologies introduced as the internal light extraction technologies are still in a laboratory stage, and thus the development of an internal light extraction technology applicable to mass production is urgently desired.

DISCLOSURE OF INVENTION

Technical Problem

An aspect of the present invention is to provide a layered structure for an OLED device, which can effective extract light trapped in an optical waveguide and a glass substrate in the OLED device to significantly improve the external light efficiency of the OLED device, thus improving the efficiency, brightness, and lifespan of the OLED device.

Another aspect of the present invention is to provide a method for manufacturing a layered structure for an OLED device, which can manufacture the layered structure for the OLED device in mass production with a simple process and low cost.

Still another aspect of the present invention is to provide an OLED device having the layered structure for the OLED device.

Solution to Problem

According to an aspect of the present invention, there is provided a layered structure for an organic light-emitting diode (OLED) device, the layered structure comprising a light-transmissive substrate and an internal extraction layer formed on one side of the light-transmissive substrate, wherein the internal extraction layer may comprise: a scattering area containing scattering elements composed of solid particles and pores, the solid particles having a density that decreases as it goes away from the interface with the light-transmissive substrate, and the pores having a density that increases as it goes away from the interface with the light-transmissive substrate; and a free area where no scattering elements are present, formed from the surface of the internal extraction layer, which is opposite to the interface, to a predetermined depth.

Here, more than about 90% of all solid particles may be present in a first area corresponding to one-half or two-thirds of the entire thickness of the internal extraction layer from the interface.

In an embodiment, the density of the pores in a second area may be higher than that of the pores in the first area, the second area being defined between the boundary of the first area and the boundary of the free area.

In an embodiment, the first area may have a thickness of about 5 to 15 μm, the second area may have a thickness of about 3 to 10 μm, and thus the entire thickness of the internal extraction layer may be about 8 to 25 μm.

In an embodiment, the free area may have a thickness of about 0.25 to 2.0 μm.

In an embodiment, the density of the scattering elements may gradually decrease as it goes from the interface to the boundary of the free area.

In an embodiment, the solid particles may comprise at least one selected from the group consisting of $SiO_2$, $TiO_2$ and $ZrO_2$.

In an embodiment, the internal extraction layer may comprise a glass material.

The glass material may comprise about 55 to 84 wt % $Bi_2O_3$, 0 to about 20 wt % BaO, about 5 to 20 wt % ZnO, about 1 to 7 wt % $Al_2O_3$, about 5 to 15 wt % $SiO_2$, about 5 to 20 wt % $B_2O_3$. The glass material may optionally comprise about 0.05 to 3 wt % $Na_2O$ and/or 0 to about 0.3 wt % $CeO_2$.

The layered substrate for the OLED device may further comprise a light-transmissive barrier layer formed on the internal extraction layer.

The barrier layer may comprise $SiO_2$ and/or $Si_3N_4$. The barrier layer can be formed as a monolayer or as a multilayer (for example, alternating $SiO_2$ and $Si_3N_4$ layers).

In an embodiment, the barrier layer may have a thickness of about 5 to 50 nm, especially 10 to 30 nm.

According to another aspect of the present invention, there is provided a method for manufacturing a layered structure for an organic light-emitting diode (OLED) device, the method comprising: preparing a light-transmissive substrate; coating a first frit paste comprising a frit and solid particles on the light-transmissive substrate and drying the resulting substrate; coating a second frit paste comprising the frit on the coating layer of the first frit paste; smoothing the surface of the coating layer of the second frit paste by keeping the resulting substrate, on which the first and second frit pastes are coated, for a predetermined time and then drying the resulting substrate; and heating the light-transmissive substrate on which the first and second frit pastes are coated.

In an embodiment, the first frit paste may comprise 70 to 80 wt % frit and 0.5 to 6 wt % solid particles, and the remainder thereof may comprise a binder and a solvent.

In an embodiment, the second frit paste may comprise 66 to 76 wt % frit, and the remainder thereof may comprise a binder and a solvent.

In an embodiment, the solid particles may comprise at least one selected from the group consisting of $SiO_2$, $TiO_2$ and $ZrO_2$.

The frit may comprise about 55 to 84 wt % $Bi_2O_3$, 0 to about 20 wt % BaO, about 5 to 20 wt % ZnO, about 1 to 7 wt % $Al_2O_3$, about 5 to 15 wt % $SiO_2$, about 5 to 20 wt % $B_2O_3$. The frit may optionally comprise about 0.05 to 3 wt % $Na_2O$ and/or 0 to about 0.3 wt % $CeO_2$.

In the procedure of smoothing the surface of the coating layer of the second frit paste, the surface of the second frit paste coating layer may be rapidly smoothed by irradiating ultrasonic waves to the coating layers of the first and second frit pastes and, at the same time, a diffusion area of the solid particles between the coating layers of the first and second frit pastes may be activated and then dried.

The method according to an embodiment of the present invention may further comprise, after the heating the light-transmissive substrate on which the first and second frit pastes are coated, forming a barrier layer comprising $SiO_2$ and/or $Si_3N_4$. The barrier layer can be formed as a monolayer or as a multilayer (for example, alternating $SiO_2$ and $Si_3N_4$ layers).

In an embodiment, the barrier layer may have a thickness of about 5 to 50 nm, especially 10 to 30 nm.

According to another aspect of the present invention, there is provided an organic light-emitting diode (OLED) device comprising: a light-transmissive substrate; an internal extraction layer formed on the light-transmissive substrate and comprising a scattering area containing scattering elements composed of solid particles and pores, the solid particles having a density that decreases as it goes away from the interface with the light-transmissive substrate, and the pores having a density that increases as it goes away from the interface with the light-transmissive substrate, and a free area where no scattering elements are present, formed from the surface of the internal extraction layer, which is opposite to the interface, to a predetermined depth; a light-transmissive electrode layer formed on the internal extraction layer; an organic layer formed on the light-transmissive electrode layer; and a reflective electrode formed on the organic layer.

Here, more than about 90% of all solid particles may be present in a first area corresponding to one-half or two-thirds of the entire thickness of the internal extraction layer from the interface.

In an embodiment, the density of the pores in a second area may be higher than that of the pores in the first area, the second area being defined between the boundary of the first area and the boundary of the free area.

In an embodiment, the density of the scattering elements may gradually decrease as it goes from the interface to the boundary of the free area.

In an embodiment, the internal extraction layer may comprise a glass material comprising about 55 to 84 wt % $Bi_2O_3$, 0 to about 20 wt % BaO, about 5 to 20 wt % ZnO, about 1 to 7 wt % $Al_2O_3$, about 5 to 15 wt % $SiO_2$, about 5 to 20 wt % $B_2O_3$. The glass material may optionally comprise about 0.05 to 3 wt % $Na_2O$ and/or 0 to about 0.3 wt % $CeO_2$.

The OLED device may further comprise a barrier layer comprising $SiO_2$ and/or $Si_3N_4$ and formed between the internal extraction layer and the light-transmissive electrode layer. The barrier layer can be formed as a monolayer or as a multilayer (for example, alternating $SiO_2$ and $Si_3N_4$ layers).

In an embodiment, the barrier layer may have a thickness of about 5 to 50 nm, especially 10 to 30 nm.

According to a further aspect of the present invention, there is provided a layered structure for an OLED device, the layered structure comprising a light-transmissive substrate and an internal extraction layer formed on one side of the light-transmissive substrate, wherein the internal extraction layer comprises a glass material comprising about 55 to 84 wt % $Bi_2O_3$, 0 to about 20 wt % BaO, about 5 to 20 wt % ZnO, about 1 to 7 wt % $Al_2O_3$, about 5 to 15 wt % $SiO_2$, about 5 to 20 wt % $B_2O_3$. The glass material may optionally comprise about 0.05 to 3 wt % $Na_2O$ and/or 0 to about 0.3 wt % $CeO_2$.

Advantageous Effects of Invention

The layered structure for the OLED device according to an embodiment of the present invention can effectively extract light trapped in the optical waveguide and the glass substrate in the OLED device to significantly improve the external light efficiency of the OLED device, thus improving the efficiency, brightness, and lifespan of the OLED device.

Moreover, the method for manufacturing the layered structure for the OLED device which can manufacture the layered structure for the OLED device in mass production with a simple process and low cost.

BRIEF DESCRIPTION OF DRAWINGS

The above and other features and benefits of the present invention will become more apparent by describing in detail exemplary embodiments thereof with reference to the attached drawings in which:

FIG. 1 is a cross-sectional view showing the structure of a layered structure for an OLED device and an OLED device having the same according to an embodiment of the present invention;

FIG. 2 is a schematic diagram showing the light-scattering effect according to the structure of an internal extraction layer provided in the layered structure for the OLED device of FIG. 1;

FIG. 3 is a graph showing the density distribution of all scattering elements contained in the internal extraction layer of FIG. 2, which is normalized to the thickness of the internal extraction layer;

FIG. 4 is an SEM image of the internal extraction layer of FIG. 3;

FIG. 5 is graphs showing changes in light diffusion and light absorbance according to the density of solid particles contained in the internal extraction layer;

FIG. 6 is graphs showing changes in light absorbance and light transmittance according to a change in thickness of the internal extraction layer;

FIG. 7 is a graph showing a difference in light absorbance according to whether a frit as a material for the internal extraction layer contains a transition metal; and FIG. 8 is a flowchart showing a method for manufacturing a layered structure for an OLED device according to an embodiment of the present invention.

BEST MODE FOR CARRYING OUT THE INVENTION

Reference will now be made in detail to the embodiments of the present general inventive concept, examples of which are illustrated in the accompanying drawings, wherein like reference numerals refer to like elements throughout. The embodiments are described below in order to explain the present general inventive concept by referring to the figures. In the drawings, the thicknesses of layers and regions are exaggerated for clarity. Throughout the specification, like reference numerals represent the same components.

Hereinafter, a layered structure 20 for an OLED device and an OLED device 10 having the same according to an embodiment of the present invention will be described with reference to the accompanying drawings.

[Layered Structure for OLED Device]

A layered structure 20 for an OLED device according to an embodiment of the present invention is formed on a light-transmissive electrode layer 300 of an OLED device 10 (in particular, with a bottom emission structure) to improve the efficiency of extracting light generated in the OLED device 10 to the outside.

FIG. 1 schematically shows the structure of the layered structure 20 for the OLED device and the OLED device 10 having the same according to an embodiment of the present invention. The layered structure 20 for the OLED device generally comprises a light-transmissive substrate 100 and an internal extraction layer 200 formed on one side of the light-transmissive substrate 100.

The light-transmissive substrate 100 is formed of a material having a high transmittance to visible light, and a glass substrate or a plastic substrate may be used as the high transmittance material. However, the glass substrate, whose refractive index can be easily adjusted, and which can withstand high temperature when a frit paste, which will be described later, is applied thereto and fired at a high temperature of 500 to 750° C., is desirable in an embodiment of the present invention. Here, an inorganic glass such as alkali glass, alkali-free glass, high strain point glass, quartz glass, etc. may be used for the glass substrate. However, the use of the plastic substrate is not excluded as long as the above conditions are satisfied.

In an embodiment, the glass substrate has a refractive index of about 1.5 to 1.6, because the higher the refractive index, the smaller the critical angle, thus causing the total reflection even at a small incident angle, which is thus not desirable.

The internal extraction layer 200 formed on one side of the light-transmissive substrate 100 is a kind of scattering layer provided to prevent light, which is generated by recombination of electrons and holes in an organic layer 400 of the OLED device 10, from being lost by the waveguide effect in the light-transmissive substrate 100, and belongs to the technology for improving the light extraction efficiency of the OLED device 10 through the above-described internal light extraction. The internal extraction layer 200 may also be made of a glass material and may be formed, for example, by applying a frit paste to one side of the light-transmissive substrate 100 and firing the resulting light-transmissive substrate 100 at a high temperature.

Scattering elements 210 are contained in the internal extraction layer 200 and are composed of solid particles 211 comprising at least one selected from the group consisting of $SiO_2$, $TiO_2$, and $ZrO_2$, for example, and pores 212 comprising air or gas bubbles. The light incident into the internal extraction layer 200, i.e., the light incident directly from the organic layer 400 as well as the light totally reflected from the interface between the light-transmissive substrate 100 and air and fed back to the internal extraction layer 200 are randomly scattered by the plurality of scattering elements 210 and, during this process, the light having an incident angle smaller than the critical angle exits to the outside of the light-transmissive substrate 100, thus improving the light extraction efficiency.

In particular, in the layered structure 20 for the OLED device according to an embodiment of the present invention, the internal extraction layer 200 is broadly divided into two regions, in more detail, three regions, which are schematically shown in the partially enlarged view of FIG. 1.

The structure of the internal extraction layer 200 may be broadly divided into a scattering region D, which comprise the scattering elements 210 composed of the solid particles 211 and the pores 212, and a free region F where no scattering elements 210 are present, formed from the surface of the internal extraction layer 200, which is opposite to the interface with the light-transmissive substrate 100, to a predetermined depth. As mentioned above, the scattering area D is an area where the light incident into the internal extraction layer 200 is scattered in various ways, and the free area F is a kind of buffer zone to prevent the flatness of the surface of the internal extraction layer 200 from being degraded by the scattering elements 210.

A significant feature of an embodiment of the present invention is that the scattering area D comprises both the solid particles 211 and the pores 212, whose individual and overall densities are uniformly distributed over the depth of the internal extraction layer 200.

First, the individual density of the solid particles 211 and the pores 212 will be described below. Based on the interface between the light-transmissive substrate 100 and the internal extraction layer 200, the density of the solid particles 211 decreases as it goes away from the interface, while the density of the pores 212 increases as it goes away from the interface. This complex distribution of the solid particles 211 and the pores 212 is provided in view of the properties of the different types of scattering elements 210. The pores 212 are formed by oxygen gas generated during reduction of $Bi_2O_3$ and BaO contained in the frit paste as the material for the internal extraction layer 200 and provide a strong scattering effect. However, the pores 212 tend to be concentrated at the top of the internal extraction layer 200 due to the nature of the gas, which makes it difficult to obtain a desired distribution of the pores 212. To make up for the drawback of the pores 212, the solid particles 211 are controlled to have a higher density distribution as they are closer to the interface between the light-transmissive substrate 100 and the internal extraction layer 200. Since it is easier to control the density distribution of the solid particles 211 than that of the pores 212, it is possible to artificially control the distribution of the scattering elements 210 in the above manner.

The free area F configured to prevent the flatness of the surface of the internal extraction layer 200 from being degraded by the scattering elements 210 has a thickness range of about 0.5 to 2.0 μm. Due to the presence of the free area F, the flatness of the surface of the internal extraction layer 200 satisfies the surface roughness conditions of $\Delta Ra<1$ nm and $\Delta Rpv<15$ nm, where $\Delta Ra$ represents the center line average roughness and $\Delta Rpv$ represents the maximum height roughness. If the surface roughness of this level is not satisfied, sparks are produced along the surface shape of the internal extraction layer 200 when the light-transmissive electrode layer 300, the organic layer 400, etc. are deposited on the internal extraction layer 200, thus causing defects such as short-circuit, etc.

Next, when the structure of the internal extraction layer 200 is divided into three areas in detail, the scattering area is divided into two areas such as a first area D1 and a second area D, which are related to the frit paste for controlling the density of the solid particles 211 and the pores 212, respectively.

The first area D1 is an area where more than about 90% of all solid particles 211 are present and corresponds to one-half or two-thirds of the entire thickness of the internal extraction layer 200 from the interface. That is, most of the solid particles 211 are present in the first area D1, which is formed by a first frit paste containing the solid particles 211, which will be described later.

The second area D2 refers to the middle area between the boundary of the first area D1 and the boundary of the free area F, and the density of the pores 212 in the second area D2 is higher than that of the pores 212 in the first area D1. That is, in addition to a small amount of solid particles 211, most of the pores 212 are contained in the second area D2, which is mainly formed by a second frit paste containing no solid particles 211.

Meanwhile, the distribution of all scattering elements 210 is also relevant in addition to the individual density of the solid particles 211 and the pores 212 which constitute the scattering elements 210. The density of the scattering elements 210 gradually decreases as it goes from the interface between the light-transmissive substrate 100 and the internal extraction layer 200 to the boundary of the free area F. The graph of FIG. 3 shows the density of the scattering elements 210 normalized with respect to the thickness of the internal extraction layer 200. Moreover, FIG. 4 is an SEM image of the internal extraction layer corresponding to the density distribution of the scattering elements 210 of FIG. 3, in which the elements that appear darker are the solid particles 211 and the elements that appear lighter are the pores 212.

The overall distribution pattern of the scattering elements 210 is controlled mainly by the density of the solid particles 211. Moreover, the highest density of the scattering elements 210 in the area adjacent to the boundary is formed for the purpose of providing a smaller path of light which is scattered by the scattering elements 210 after being extracted from the internal extraction layer 200 to the light-transmissive substrate 100, reflected from the interface between the light-transmissive substrate 100 and air, and incident into the internal extraction layer 200. That is, as shown schematically in FIG. 2, in the internal extraction layer 200 of structure (b) having a higher density of scattering elements 210, in particular, solid particles 211 on the interface, compared to structure (a) on the left side, most light is scattered near the interface between the light-transmissive substrate 100 and the internal extraction layer 200, not in the deep inner area, and thus it is possible to reduce the loss of light due to the extension of the optical path as much as possible, which results in an improvement of the light extraction efficiency.

The following table 1 shows the optical efficiency and its increase rate of the internal extraction layer 200 formed in the OLED device 10 with respect to the OLED device 10 having no internal extraction layer 200. In Examples 1 and 2 shown in table 1, $TiO_2$ and $SiO_2$ were used as the solid particles 211, respectively, the same glass material made of a frit comprising about 55 to 84 wt % $Bi_2O_3$, 0 to about 20 wt % BaO, about 5 to 20 wt % ZnO, about 1 to 7 wt % $Al_2O_3$, about 5 to 15 wt % $SiO_2$, about 5 to 20 wt % $B_2O_3$, about 0.1 to 3 wt % $Na_2O$, and 0 to about 0.3 wt % $CeO_2$ (which will be described in detail later) was used as the light-transmissive substrate 100, and the density (2 wt %) of the solid particles 211 was controlled to be the same.

TABLE 1

Measured values of the increase in optical efficiency due to the formation of the internal extraction layer

| | Measured values | | | |
|---|---|---|---|---|
| | Optical Efficiency (lm/W) | | Increased rate (%) | |
| Measured Position | In the air | In the glass substrate | In the air | In the glass substrate |
| Reference | 37.1 | 68.4 | — | — |
| Example 1 | 60.9 | 90.1 | +64 | +32 |
| Example 2 | 63.8 | 92.8 | +72 | +36 |

Measurement of the optical efficiency was performed on the light extracted to the outside of the glass substrate (expressed as "in the air") and the light extracted from the glass substrate before exiting to the air (expressed as "in the glass substrate") in accordance with Examples 1 and 2 of the OLED devices 10 each having the internal extraction layer 200 compared to the Reference of the OLED device 10 having no internal extraction layer 200. As the solid particles 211, $TiO_2$ was used in Example 1 and $SiO_2$ was used in Example 2.

As can be seen from table 1, due to the presence of the internal extraction layer 200 in the OLED device 10 according to an embodiment of the present invention, the optical efficiency of the light extracted to the air was increased more than 60%.

Moreover, it should be noted that the optical efficiency of the light extracted to the air was increased about two times compared to the optical efficiency of the light extracted from the glass substrate. This fact shows that the layered structure 20 for the OLED device according to an embodiment of the present invention make a significant contribution to the external light extraction as well as the internal light extraction, which results from the fact the scattering elements 210 contained in the internal extraction layer 200 have a higher density as they are closer to the interface with the light-transmissive substrate 100 (i.e., the glass substrate) as shown in FIGS. 2 and 3.

Moreover, most of the scattering elements 210, which are contained in the internal extraction layer 200 to shorten the path of the light scattered near the interface between the light-transmissive substrate 100 and the internal extraction layer 200, are the solid particles 211, and thus the density of the solid particles 211 also affects the optical efficiency. FIG. 5 is a graph showing the changes in light diffusion and light absorbance obtained when the density of $TiO_2$ particles as the solid particles 211 was changed to 1 wt % and 2 wt %, respectively. As expected, it can be seen that the increase in the density of the solid particles 211 increases the amount of light diffused, which in turn increases the optical path in the internal extraction layer 200 to increase the light absorbance, which is unfavorable for the light extraction. Thus, it can be seen that there is a density range of the solid particles 211, which is suitable for the light extraction, and this density range can be obtained experimentally.

Here, the thickness of the internal extraction layer 200 that constitutes the layered structure 20 for the OLED device according to an embodiment of the present invention will be described. The thickness of the first area D1 is about 5 to 15 μm, the second area D2 is about 3 to 10 μm, and thus the entire thickness of the internal extraction layer 200 is about 8 to 25 μm. The reason that the entire thickness of the internal extraction layer 200 is selected as about 8 to 25 μm is as follows. As can be seen from the graph of FIG. 5, when the scattering elements 210 of the same content are present, as the thickness of the internal extraction layer 200 is smaller, the light absorbance decreases (as shown in the left graph of FIG. 5) and the light transmittance increases (as shown in the right graph of FIG. 5), which is desirable; however, it is necessary to consider the minimum thickness desired to maintain the flatness of the surface of the internal extraction layer 200. That is, the thickness of about 8 μm is the minimum margin for the flatness, and the thickness of about 25 μm is the upper limit for the light transmittance.

Meanwhile, a light-transmissive barrier layer 250 may be further formed on the internal extraction layer 200 of the layered structure 20 for the OLED device, the barrier layer 250 being formed of $SiO_2$ or $Si_3N_4$.

The barrier layer 250 is to protect the internal extraction layer 200 from an etching solution when the light-transmissive electrode layer 300, for example, ITO is deposited on the internal extraction layer 200 and patterned. When the barrier layer 250 is employed, it is easier to use a wet etching process, which is relatively inexpensive.

Moreover, the barrier layer 250 can reduce the light absorbance to improve the optical properties of the light-transmissive electrode layer 300. However, the refractive index of $SiO_2$ is about 1.45, which is lower about 0.4 times than that of ITO and thus may cause the total reflection, which is problematic.

However, when the barrier layer 250 composed of $SiO_2$ is controlled to have a small thickness, the light transmission occurs even at an incident angle greater than the critical angle due to optical tunneling, and thus it is possible to minimize the optical loss caused by the total reflection and compensate for some optical loss by improving the optical properties of the light-transmissive electrode layer 300.

A range of about 5 to 50 nm is established as a desired thickness of the barrier layer 250 based on the above-described theoretical background. With the thickness smaller than the lower limit, it is difficult to expect the effect as an etching barrier, and when the thickness exceeds the upper limit, the optical loss caused by the total reflection increases rapidly.

However, the refractive index of $Si_3N_4$ is about 2.05, which is higher about 0.2 times than that of ITO, and thus the possibility that the total reflection occurs is relatively low. Accordingly, the upper limit of the thickness can be increased slightly when the barrier layer 250 is formed of $Si_3N_4$.

TABLE 2

Chemical resistance test of the barrier layer with respect to chemical etching

| Immersion time (min) | Layer | Amount of removal (Depth of etching) | |
|---|---|---|---|
| | | With $SiO_2$ Barrier layer | With $SiO_2$ Barrier layer |
| 5 | ITO | 70 nm | 70 nm |
| | IEL | x | x |
| 10 | ITO | 150 nm(Residues observed) | 150 nm(Residues observed) |
| | IEL | x | IEL exposed |
| 15 | ITO | Completely removed | Completely removed |
| | IEL | x | Completely removed |
| 20 | ITO | Completely removed | — |
| | IEL | x | — |

The above table 2 shows the results of etching obtained by immersing a layered structure, in which an $SiO_2$ barrier layer of 10 nm in thickness is formed between an internal extraction layer of about 20 μm in thickness formed on a soda lime glass substrate of about 0.7 nm in thickness and an ITO layer of about 140 nm in thickness, and a layered structure, in which no $SiO_2$ barrier layer is formed, in a dilute hydrochloric acid solution (4 wt % HCl+96 wt % distilled water at 25° C.), respectively, and observing the degree of etching as the immersion time goes.

As shown in table 2, about half the thickness of the ITO layer was etched at an immersion time of about 1 minute, and the internal extraction layer was completely removed after the lapse of the immersion time of 15 minutes in the layered structure without the $SiO_2$ barrier layer. Compared to this, in the layered structure with the $SiO_2$ barrier layer, the internal extraction layer was not exposed even after the lapse of the immersion time of 20 minutes, from which it could be seen that the $SiO_2$ barrier layer could effectively protect the internal extraction layer from the chemical etching.

Moreover, in order to examine the improvement of the optical properties of the light-transmissive electrode layer 300, the light transmittance and light absorbance of a layered structure, in which an $SiO_2$ barrier layer of about 10 nm in thickness is formed between an ITO layer of about 140 nm in thickness and a soda lime glass substrate of about 0.7 nm in thickness, and a layered structure, in which no $SiO_2$ barrier layer is formed, were measured. As a result, while the light transmittance and light absorbance of the layered structure without the $SiO_2$ barrier layer were 85.9% and 2.6%, the light transmittance was increased to 87.1% and the light absorbance was reduced to 2.3% due to the $SiO_2$ barrier layer interposed therebetween. That is, the optical properties of the ITO layer were significantly improved owing to introduction of the $SiO_2$ barrier layer.

Accordingly, the barrier layer 250 of about 5 to 50 nm in thickness formed on the internal extraction layer 200 can protect the internal extraction layer 200 from the chemical etching and further increase the overall light extraction effect of the layered structure 20 for the OLED device.

[Composition of Glass Material or Frit]

A relevant element of the layered structure 20 for the OLED device, which is configured to improve the efficiency of extracting light generated in the OLED device 10 to the outside, is the internal extraction layer 200. In particular, in the present embodiment, the internal extraction layer 200 is made of a glass material so as to control the density and distribution of the scattering elements 210 composed of the solid particles 211 and the pores 212 during the manufacturing process.

In particular, in the present embodiment, the internal extraction layer 200 is made of a glass material using a glass frit, and it is possible to obtain appropriate optical properties by controlling the composition of the frit. In the following description of the embodiments of the present invention, the glass frit will be simply referred to as the "frit". The frit is especially well adapted as a raw material to the formation of the glass material comprised in the internal extraction layer 200 of an embodiment of the present invention. Thanks to its high refractive index, the frit can also be beneficially used as a raw material in the formation of any glass material comprised in an internal extraction layer for any OLED device. As a consequence, the desired features of the frit disclosed in an embodiment of the present invention can be associated with any internal extraction layer comprising a glass material. When using a glass frit to obtain the glass material, the composition of the frit is the same as the composition of the glass material. Consequently, the desired compositional features of the frit given here below also correspond to desired compositional features of the glass material comprised in the internal extraction layer. In an embodiment, the internal extraction layer comprises an area containing (in addition to the glass material) scattering elements, especially solid particles and/or pores, and a free area where no scattering elements are present, composed of the glass material. The free area forms the surface of the internal extraction layer which is opposite to the interface between the internal extraction layer and the light-transmissive substrate. In an embodiment, the thickness of the free area is of at least 1 micrometer, or even 3 micrometers or else 5 micrometers. It is preferably of at most 20 or even 15 micrometers.

The main component of the frit as a raw material for the formation of the internal extraction layer 200 of an embodiment of the present invention is $Bi_2O_3$ (or $Bi_2O_3+BaO$)—ZnO—$B_2O_3$—$Al_2O_3$—$SiO_2$—$Na_2O$, in which $Bi_2O_3$ (or $Bi_2O_3+BaO$) is the major component, and in particular, the frit should not contain any transition metals having a high light absorbance such as Fe, Cu, Mn, Co, V, Cr, Ni, etc., except for unavoidable traces.

The composition of the frit for the internal extraction layer 200 should meet the conditions such as a refractive index of about 1.7 to 2, for example at least 1.8 or even 1.9 in an embodiment, a firing temperature of 500 to 570° C., and a thermal expansion coefficient of 70 to $90 \times 10^{-7}$/° C. The range of the refractive index corresponds to the refractive indices of the light-transmissive electrode layer 300 and the organic layer 400 and is established to minimize the effect that the difference in the refractive index has on the light extraction efficiency. Moreover, the ranges of the firing temperature and the thermal expansion coefficient are set to prevent the glass substrate corresponding to the light-transmissive substrate, which is the basis for the formation of the internal extraction layer 200, from being deformed or deteriorated during the firing process of the frit.

The composition of the frit (or of the glass material) comprises about 55 to 84 wt % $Bi_2O_3$, 0 to about 20 wt % BaO, about 5 to 20 wt % ZnO, about 1 to 7 wt % $Al_2O_3$, about 5 to 15 wt % $SiO_2$, about 5 to 20 wt % $B_2O_3$. The composition may optionally comprise about 0.05 to 3 wt % $Na_2O$ and/or 0 to about 0.3 wt % $CeO_2$. The composition of the frit (or of the glass material) may consist essentially of (or consist of) about 55 to 84 wt % $Bi_2O_3$, even 65 to 80 wt % $Bi_2O_3$, 0 to about 20 wt % BaO, about 5 to 20 wt % ZnO, about 1 to 7 wt % $Al_2O_3$, about 5 to 15 wt % $SiO_2$, about 5 to 20 wt % $B_2O_3$, about 0.05 to 3 wt % $Na_2O$ and 0 to about 0.3 wt % $CeO_2$.

$Bi_2O_3$ is a component for reducing the softening point of the frit and increasing the refractive index, and BaO is an auxiliary component that may be contained together with $Bi_2O_3$. Here, the content of $Bi_2O_3$ should be controlled to about 55 to 84 wt %, especially 55 to 83.95 wt %, and the content of BaO should be controlled to 0 to about 20 wt %. In an embodiment, the content of $Bi_2O_3$ is at least about 60 wt % or 62 wt % or even 65 wt %. It may especially be about 60 to 80 wt % or even 62 to 78 wt % or 65 to 75 wt %. In an embodiment, the content of BaO may be 0 to about 10 wt %, especially 0 to 5 wt %, even 0 to 2 wt %. In some embodiments, the content of BaO can be zero. If the content of $Bi_2O_3$ is less than the lower limit, the refractive index decreases, which makes it difficult to satisfy the range of the refractive index of about 1.7 to 2.0, and the firing temperature also increases, which makes it difficult to apply analkali glass to the substrate. If the content of $Bi_2O_3$ exceeds the upper limit, light in the blue range is strongly absorbed, and the thermal stability decreases during firing, thus deteriorating the surface of the light extraction layer. BaO has a slight effect of reducing the softening point of the frit and thus can substitute for some $Bi_2O_3$. However, if the content of BaO exceeds the upper limit, the firing temperature may exceed a permissible range, which is problematic.

ZnO is a component for reducing the softening point of the frit. The content of ZnO should be controlled to about 5 to 20 wt %, especially up to 15 wt % or 13 wt %, even 12 wt % or 10 wt %. The content of ZnO is about 8 to 15 wt % or 9 to 13 wt %. If the content of ZnO is less than the lower limit, the firing temperature of the frit increases, whereas, if it exceeds the upper limit, the phase of the frit becomes unstable, the chemical resistance decreases, and light in the green range is strongly absorbed, which is thus not desirable.

$B_2O_3$ is a component for reducing the thermal expansion coefficient and stabilizing the phase of the frit. The content of $B_2O_3$ should be controlled to about 5 to 20 wt %, especially up to 15 wt % or 12 wt %. The content of $B_2O_3$ is about 6 to 15 wt % or 7 to 12 wt %. If the content of $B_2O_3$ is less than the lower limit, the phase of the frit becomes unstable, whereas, if it exceeds the upper limit, the water resistance of the light extraction layer decreases, which is thus not desirable.

$Al_2O_3$ is a component for stabilizing the phase of the frit. The content of $Al_2O_3$ should be controlled to about 1 to 7 wt %, for example at least 1.5 or 2 wt % in an embodiment. In an embodiment, it is about 1.5 to 5 wt %, especially 2 to 4 wt %. If the content of $Al_2O_3$ is less than the lower limit, the phase of the frit becomes unstable and the chemical resistance decreases, whereas, if it exceeds the upper limit, the refractive index of the frit decreases and the firing temperature increases, which is thus not desirable.

$SiO_2$ is a component for stabilizing the phase of the frit. The content of $SiO_2$ should be controlled to about 5 to 15 wt %, for example up to 14 wt % in an embodiment or 12 wt %, especially 6 to 14 wt % or 7 to 12 wt %. If the content of $SiO_2$ is less than the lower limit, the phase of the frit becomes unstable, whereas, if it exceeds the upper limit, the refractive index of the frit decreases and the firing temperature increases, which is thus not desirable.

$Na_2O$ is an optional component for reducing the softening point of the fit. The content of $Na_2O$ should be controlled to about 0.05 to 3 wt %, especially at least 0.1 wt %. In an embodiment, it is about 0.1 to 2 wt % or 0.5 to 1.5 wt %. If the content of $Na_2O$ is less than the lower limit, the firing temperature of the frit increases, whereas, if it exceeds the upper limit, the chemical resistance decreases, which is thus not desirable.

In an embodiment, the $TiO_2$ content is up to about 1 wt %, or even 0.5 wt %, or 0.1 wt %. In an embodiment, the $ZrO_2$ content is also up to about 1 wt %, or even 0.5 wt %, or 0.1 wt %. In an embodiment, the frit does even not contain any of $TiO_2$ or $ZrO_2$, except for unavoidable traces (for example lower than 0.05 wt %), since the oxides have proven to promote the crystallization of the glass material.

In an embodiment, the fit does not contain any of Nb, P, Pb, Ta, Y, Sn, Gd, La, V, or Mo.

Here, the frit according to the embodiment of the present invention should not contain any transition metals chosen from Fe, V, Cr, Mn, Ni, Co, Cu, Pd, Ag, Au, Pt, Cd. The transition metal serves to inhibit the reduction of $Bi_2O_3$, etc. at a high temperature, thus preventing yellowing of films. Accordingly, a transition metal is generally added to the frit containing $Bi_2O_3$. However, these transition metals exhibit strong absorption properties in a specific wavelength region. In particular, when the optical path is increased due to the scattering in the internal extraction layer 200, the light absorption by the transition metal may cause a significant optical loss, and thus it is necessary to eliminate the addition of the transition metal to the first. However, the light absorption properties of an oxide of Ce, is limited to a dark blue region, and thus the optical effect on an OLED lighting device having a fluorescent blue light source is insignificant. Moreover, the oxide of Ce facilitates the complete combustion of organic components during burnout process in the manufacturing of the light extraction layer, and thus $CeO_2$ may be added in an amount less than 0.3 wt %, for example 0.1 wt % in an embodiment. The $CeO_2$ content can be zero in some embodiments.

FIG. 7 is a graph comparing the light absorbance of Example 1 being a frit containing 70 wt % $Bi_2O_3$ (0 wt % BaO), 10 wt % ZnO, $Al_2O_3$ 3 wt %, $SiO_2$ 7 wt %, 9 wt % $B_2O_3$, and 1 wt % $Na_2O$, Example 2 in which 0.1 wt % $CeO_2$ is added to the above frit, and Comparative Example 1 in which 0.1 wt % CuO+MnO+CoO is added to the above frit of Example 1. As shown in FIG. 7, it can be seen that the light absorbance is increased when the transition metals are added to the frit. Comparative Example 1, where the oxides of Cu, Mn, and Co are added, shows a surprisingly high increase in light absorbance over a wide wavelength range. Compared to this, Example 2, where 0.1 wt % $CeO_2$ is added, shows good results of a slight increase in light absorbance in a dark blue region where the wavelengths are below about 400 nm. Example 1 is therefore preferred.

When comparing the results of FIG. 7 to those of FIG. 5, the optical path is increased by the increase in light scattering due to the addition of the solid particles 211, and when the transition metals such as Fe, Mn, Cu, Mo, etc. are added to the frit, the light absorption effect of the transition metals according to the increase in the optical path is further increased, which will clearly have a significant adverse effect on the light extraction.

[Method for Manufacturing Layered Structure for OLED Device]

A method for manufacturing a layered structure 20 for an OLED device in accordance with an embodiment of the present invention will be described below.

The method for manufacturing the layered structure 20 for the OLED device according to an embodiment of the present invention comprises a process of preparing a light-transmissive substrate 100, a process of coating a first frit paste comprising a frit and solid particles 211 on the light-transmissive substrate 100 and drying the resulting substrate 100, a process of coating a second frit paste comprising the frit on the coating layer of the first frit paste, a process of smoothing the surface of the coating layer of the second frit paste by keeping the resulting substrate 100, on which the first and second frit pastes are coated, for a predetermined time and then drying the resulting substrate 100, and a process of heating the light-transmissive substrate 100 on which the first and second frit pastes are coated.

The process of preparing the light-transmissive substrate 100 is to prepare a substrate, which is the basis for the formation of an internal extraction layer 200, the substrate being formed of a material having a high transmittance to visible light as mentioned above and, in particular, corresponding to a glass substrate. The basic properties such as the firing temperature, refractive index, etc., which are needed for the light-transmissive substrate 100, are the same as previously described.

The process of coating the first frit paste comprising the frit and the solid particles 211 on the light-transmissive substrate 100 and drying the resulting substrate 100 corresponds to a process for forming a first area D1 comprising most of the solid particles 211 in the internal extraction layer 200.

The first frit paste comprises 70 to 80 wt % frit and 0.5 to 6 wt % solid particles 211, and the remainder thereof comprises a binder and a solvent. The components of the frit are the same as previously described, and the solid particles 211 comprise at least one selected from the group consisting of $SiO_2$, $TiO_2$, and $ZrO_2$.

In the present embodiment, ethyl cellulose is used as the binder, pine oil and butyl cellosolve acetate (BCA) are used as the solvent, and the frit, the solid particles 211, the binder, and the solvent are uniformly mixed by stirring.

The first frit paste having the above-described composition is coated on the light-transmissive substrate 100 by slit coating or screen printing and dried in a convection oven at about 150° C. for about 20 minutes to significantly reduce the fluidity, thus facilitating the process of coating the second frit paste, which will be described in more detail below.

After coating and drying the first frit paste, the process of coating the second frit paste on the coating layer of the first frit paste continues.

The second frit paste is prepared by mixing a frit, a binder, and a solvent which are the same as those used in the first frit paste. The difference of the second frit paste from the first frit paste is that the second frit pate contains no solid particles 211. The second frit paste comprises 66 to 76 wt % frit, and the remainder thereof comprises a binder and a solvent. Moreover, the second frit paste is coated by the same method as the first frit paste.

As can be expected from the fact that the second frit paste contains no solid particles 211, this process corresponds to a process for forming a second area D2 having a high density of pores 212 in the internal extraction layer 200 and a free area F where no scattering elements 210 are present from the surface of the internal extraction layer 200 to a predetermined depth.

When the process of coating the first and second frit pastes is completed, the resulting light-transmissive substrate 100 is left for a predetermined time, for example, about 30 minutes to 2 hours such that the surface of the coating layer of the second frit paste is smoothed by gravity.

Meanwhile, during the above process, it is possible to facilitate the smoothing of the surface of the second frit paste coating layer by irradiating ultrasonic waves to the coating layers of the first and second frit pastes. In particular, when the surface of the second frit paste coating layer smoothed by the ultrasonic irradiation, it is possible to obtain an effect that a diffusion area of the solid particles 211 between the coating layers of the first and second frit pastes is activated. When the diffusion area of the solid particles 211 is activated, the non-uniform density distribution of the solid particles 211, formed between the first frit paste and the second frit paste, decreases, thus compensating for the sudden change in physical properties such as refractive index, hardness, etc.

When the coating layer of the second frit paste is smoothed, the resulting light-transmissive substrate 100 is also dried in a convection oven at about 150° C. for about 20 minutes.

The light-transmissive substrate 100 on which the first and second frit pastes are coated by the above processes is fired in a convection oven at a high temperature to form the internal extraction layer 200.

The light-transmissive substrate 100 coated with the frit pastes is first heated in a convection oven at about 350 to 430° C. for about 20 minutes such that the binder is burned out and then reheated at a higher temperature of 520 to 570° C. such that the frit pastes are fired, thus forming the internal extraction layer 200.

During the above firing process of the frit pastes, oxygen gas is dissociated from the oxide contained in the frit, in particular, from $Bi_2O_3$ contained in a large amount, thus forming pores 212 in the internal extraction layer 200. Here, the dissociated oxygen gas rises up by buoyancy, and thus the density of the pores 212 in an upper area (i.e., the second area) in the internal extraction layer 200 increases higher than a lower area (i.e., the first area).

The thickness of the free area F, which is the uppermost area of the internal extraction layer 200 where no scattering elements, in particular, pores 212 are present, is controlled by the firing temperature, time, etc. Moreover, the thickness of the free area F depends on the size of the frit. That is, the smaller the frit, the larger the surface area, and thus the thickness of the free area F is reduced even under the same firing conditions.

Meanwhile, it is possible to protect the internal extraction layer 200 from the chemical etching and increase the light extraction effect by adding a process of depositing an $SiO_2$ or $Si_3N_4$ barrier layer of 5 to 50 nm in thickness on the internal extraction layer 200 prepared by the process of coating and firing the first and second frit pastes.

As such, the method for manufacturing the layered structure 20 for the OLED device according to an embodiment of the present invention has significant benefits in that it is possible to easily control the density of the scattering elements 210 composed of the solid particles 211 and the pores 212 by separately using two types of frit pastes, such as the first frit pate containing the solid particles 211 and the second frit pate containing no solid particles 211, and by adding a large amount of $Bi_2O_3$ or $Bi_2O_3+BaO$, which generated oxygen gas during the firing process, to the frit.

[OLED Device]

An OLED device 10 provided with the layered structure 20 for the OLED device according to an embodiment of the present invention is shown in FIG. 1.

The layered structure 20 for the OLED device comprises the above-described internal extraction layer 200 interposed between the light-transmissive substrate 100 and the light-transmissive electrode layer 300 of the existing OLED device. The layered structure 20 can be directly applied to the conventional OLED device, and thus the OLED device will be described in brief.

The OLED device 10 of an embodiment of the present invention comprises the light-transmissive substrate 100 on which the above-described internal extraction layer 200 is formed, the light-transmissive electrode layer 300 formed on the internal extraction layer 200, the organic layer 400 formed on the light-transmissive electrode layer 300, and a reflective electrode 500 formed on the organic layer 400. It will be appreciated that the above-described barrier layer 250 may be further formed on the internal extraction layer 200.

The light-transmissive electrode layer (anode) 300 has a light transmittance of about 80% or higher so as to extract light generated in the organic layer 400 to the outside. Moreover, the light-transmissive electrode layer 300 has a high work function so as to inject a great amount of holes. In detail, various materials such as indium tin oxide (ITO), $SnO_2$, zinc oxide (ZnO), indium zinc oxide (IZO), ZnO—$Al_2O_3$ (AZO), ZnO—$Ga_2O_3$ (GZO), etc. are used.

The light-transmissive electrode layer 300 may be formed by forming an ITO layer on the internal extraction layer 200 and etching the ITO layer. The ITO layer may be formed by sputtering or deposition, and an ITO pattern is formed by photolithography and etching. This ITO pattern is transferred into the light-transmissive electrode layer (anode) 300.

The organic layer 400 is composed of a hole injection layer 410, a hole transporting layer 420, an emission layer 430, an electron transporting layer 440, and an electron injection layer 450. The refractive index of the organic layer 400 is about 1.7 to 1.8.

The organic layer 400 may be formed by both coating and deposition. For example, when one or more layers of the organic layer 400 are formed by the coating, the other layers are formed by the deposition. When a layer is formed by the coating and then another layer is formed thereon by the deposition, the coated layer is dried and cured by concentration before forming the organic layer by the deposition.

The hole injection layer 410 has a small difference in ionization potential so as to reduce the hole injection barrier from the anode. Improvement of hole injection efficiency from the electrode interface in the hole injection layer 410 reduces the driving voltage of the device and further increases the hole injection efficiency. In high molecular materials, polyethylene dioxythiophene doped with polystyrene sulfonic acid (PSS) (PEDOT:PSS) is widely used, and in low molecular materials, phthalocyanine type copper phthalocyanine (CuPc) is widely used.

The hole transporting layer 420 serves to transport holes injected from the hole injection layer 410 to the emission layer 430. The hole transporting layer 420 has appropriate ionization potential and hole mobility. For the hole transporting layer 420, triphenylamine derivatives, N,N'-bis(1-naphthyl)-N,N-diphenyl-1,1'-biphenyl-4,4'-diamine (NPD), N,N'-diphenyl-N,N'-bis[N-phenyl-N-(2-naphthyl)-4'-amino-biphenyl4-yl]-1,1'-biphenyl-4,4'-diamine (NPTE), 1,1-bis[(di-4-tolylamino)phenyl]cyclohexane (HTM2), N,N-diphenyl-N,N-bis(3-methylphenyl)-1,1'-diphenyl-4,4'-diamine (TPD), etc. are used.

The emission layer 430 provides a space where the injected electrons and holes recombine and is formed of a material having high light-emitting efficiency. A light-emitting host material used in the emission layer and a doping material of a light-emitting dye function as a recombination center of holes and electrons injected from the anode and cathode. The doping of the light-emitting dye to the host material in the emission layer 430 obtains a high light-emitting efficiency and further converts the emission wavelength. The light-emitting material as the organic material includes low molecular weight materials and high molecular weight materials and are classified into fluorescent materials and phosphorescent materials based on the light-emitting mechanism. Examples of materials for the emission layer 430 may include metal complexes of quinoline derivatives, such as tris(8-quinolinolato)aluminum complexes ($Alq_3$), bis(8-hydroxy)quinaldine aluminum phenoxide ($Alq'_2OPh$), bis(8-hydroxy)quinaldine aluminum-2,5-dimethylphenoxide (BAlq), mono(2,2,6,6-tetramethyl-3,5-heptanedionate) lithium complex (Liq), mono(8-quinolinolato)sodium complex (Naq), mono(2,2,6,6-tetramethyl-3,5-heptanedionate) lithium complex, mono(2,2,6,6-tetramethyl-3,5-heptanedionate)sodium complex, and bis(8-quinolinolato) calcium complex ($Caq_2$); tetraphenylbutadiene, phenylquinacridone (QD), anthracene, perylene, and fluorescent materials such as coronene. As the host material, quinolinolate complexes may be used, and for example 8-quinolinol and aluminum complexes having its derivative as a ligand may be used.

The electron transporting layer 440 serves to transport electrons injected from the electrode. For the electron transporting layer 440, quinolinol aluminum complexes ($Alq_3$), oxadiazole derivatives (e.g., 2,5-bis(1-naphthyl)-1,3,4-oxadiazole (BND) and 2-(4-t-butylphenyl)-5-(4-biphenyl)-1,3,4-oxadiazole (PBD)), triazole derivatives, bathophenanthroline derivatives, silole derivatives, etc. are used.

The electron injection layer 450 increases the injection efficiency of electrons. In the electron injection layer 450, a layer is formed of an alkali metal such as lithium (Li), cesium (Cs), etc. on a cathode interface.

For the reflective electrode (cathode) 500, a metal having a small work function or its alloy is used. Examples of materials for the cathode may include alkali metals, alkaline earth metals, and metals of group III of the periodic table. Of those, in an embodiment, aluminum (Al), magnesium (Mg), silver (Ag) or alloys thereof are used as inexpensive materials with good chemical stability. Moreover, in a polymer system, a laminate of calcium (Ca) or barium (Ba) and aluminum (Al), etc. may be used.

As described above, the layered structure for the OLED device according to an embodiment of the present invention can effectively extract light trapped in the optical waveguide and the glass substrate in the OLED device to significantly improve the external light efficiency of the OLED device, thus improving the efficiency, brightness, and lifespan of the OLED device.

Moreover, the method for manufacturing the layered structure for the OLED device which can manufacture the layered structure for the OLED device in mass production with a simple process and low cost.

While the invention has been particularly shown and described with reference to exemplary embodiments thereof, it will be understood by those of ordinary skill in the art that various changes in form and details may be made therein without departing from the spirit and scope of the invention as defined by the following claims.

It is to be understood that the present invention contemplates that, to the extent possible, one or more features of any embodiment can be combined with one or more features of any other embodiment.

INDUSTRIAL APPLICABILITY

The present invention is applicable to a layered structure for an organic light-emitting diode (OLED) device.

The invention claimed is:

1. A layered structure for an organic light-emitting diode (OLED) device, the layered structure comprising:
   a light-transmissive substrate, and
   an internal extraction layer formed on one side of the light-transmissive substrate,
   wherein the internal extraction layer comprises
      a scattering area containing scattering elements composed of solid particles and pores, the solid particles having a density that decreases as it goes away from an interface with the light-transmissive substrate, and the pores having a density that increases as it goes away from the interface with the light-transmissive substrate, wherein an overall distribution of the scattering elements decreases as it goes away from the interface with the light-transmissive substrate, so as to form a highest density of the scattering elements in an area adjacent to the interface with the light-transmissive substrate, the scattering area being divided into a first area and a second area, wherein most of the solid particles are present in the first area, which is formed by a first frit paste containing the solid particles, and most of the pores are contained in the second area, which is formed by a second frit paste containing no solid particles; and
      a free area where no scattering elements are present, formed from a surface of the internal extraction layer, which is opposite to the interface, to a predetermined depth.

2. The layered substrate for the OLED device of claim 1, wherein more than about 90% of all solid particles are present in the first area corresponding to one-half or two-thirds of an entire thickness of the internal extraction layer from the interface.

3. The layered substrate for the OLED device of claim 2, wherein the density of the pores in a second area is higher than that of the pores in the first area, the second area being defined between a boundary of the first area and a boundary of the free area.

4. The layered substrate for the OLED device of claim 3, wherein the first area has a thickness of about 5 to 15 μm, the second area has a thickness of about 3 to 10 μm, and the entire thickness of the internal extraction layer is about 8 to 25 μm.

5. The layered substrate for the OLED device of claim 4, wherein the free area has a thickness of about 0.25 to 2.0 μm.

6. The layered substrate for the OLED device of claim 1, wherein the density of the scattering elements gradually decreases as it goes from the interface to a boundary of the free area.

7. The layered substrate for the OLED device of claim 1, wherein the solid particles comprises at least one selected from the group consisting of $SiO_2$, $TiO_2$, and $Z_rO_2$.

8. The layered substrate for the OLED device of claim 1, wherein the internal extraction layer comprises a glass material.

9. The layered substrate for the OLED device of claim 8, wherein the glass material comprises about 55 to 84 wt % $Bi_2O_3$, 0 to about 20 wt % BaO, about 5 to 20 wt % ZnO, about 1 to 7 wt % $Al_2O_3$, about 5 to 15 wt % $SiO_2$, about 5 to 20 wt % $B_2O_3$ and 0 to about 0.3 wt % $CeO_2$.

10. The layered substrate for the OLED device of claim 1, further comprising a light-transmissive barrier layer formed on the internal extraction layer.

11. The layered substrate for the OLED device of claim 10, wherein the light-transmissive barrier layer comprises $SiO_2$ and/or $Si_3N_4$.

12. The layered substrate for the OLED device of claim 10, wherein the light-transmissive barrier layer has a thickness of about 5 to 50 nm.

13. An organic light-emitting diode (OLED) device comprising:
   a light-transmissive substrate;
   an internal extraction layer formed on the light-transmissive substrate and comprising a scattering area containing scattering elements composed of solid particles and pores, the solid particles having a density that decreases as it goes away from an interface with the light-transmissive substrate, and the pores having a density that increases as it goes away from the interface with the light-transmissive substrate, so as to form a highest density of the scattering elements in an area adjacent to the interface with the light-transmissive substrate, the scattering area being divided into a first area and a second area, wherein most of the solid particles are present in the first area, which is formed by a first frit paste containing the solid particles, and most of the pores are contained in the second area, which is formed by a second frit paste containing no solid particles, and a free area where no scattering elements are present, formed from a surface of the internal extraction layer, which is opposite to the interface, to a predetermined depth;
   a light-transmissive electrode layer formed on the internal extraction layer;
   an organic layer formed on the light-transmissive electrode layer, and
   a reflective electrode formed on the organic layer.

14. The OLED device of claim 13, wherein more than about 90% of all solid particles are present in the first area corresponding to one-half or two-thirds of an entire thickness of the internal extraction layer from the interface.

15. The OLED device of claim 14, wherein the density of the pores in the second area is higher than that of the pores in the first area, the second area being defined between a boundary of the first area and a boundary of the free area.

16. The OLED device of claim 13, wherein the density of the scattering elements gradually decreases as it goes from the interface to a boundary of the free area.

17. The OLED device of claim 13, wherein the internal extraction layer comprises a glass material comprising about 55 to 84 wt % $Bi_2O_3$, 0 to about 20 wt % BaO, about 5 to 20 wt % ZnO, about 1 to 7 wt % $Al_2O_3$, about 5 to 15 wt % $SiO_2$, about 5 to 20 wt % $B_2O_3$ and 0 to about 0.3 wt % $CeO_2$.

18. The OLED device of claim 13, further comprising a barrier layer comprising $SiO_2$ and/or $Si_3N_4$ and formed between the internal extraction layer and the light-transmissive electrode layer.

19. The OLED device of claim 18, wherein the barrier layer has a thickness of about 5 to 50 nm.

* * * * *